United States Patent
Kinsman

(10) Patent No.: US 7,122,390 B2
(45) Date of Patent: Oct. 17, 2006

(54) METHODS OF FABRICATION FOR FLIP-CHIP IMAGE SENSOR PACKAGES

(75) Inventor: Larry D. Kinsman, Kuna, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 11/152,519

(22) Filed: Jun. 14, 2005

(65) Prior Publication Data

US 2005/0233502 A1 Oct. 20, 2005

Related U.S. Application Data

(62) Division of application No. 10/375,864, filed on Feb. 26, 2003, now Pat. No. 6,964,886, which is a division of application No. 10/230,654, filed on Aug. 29, 2002, now Pat. No. 6,885,107.

(51) Int. Cl.
*H01L 21/00* (2006.01)
*H01L 33/00* (2006.01)
*H01L 51/20* (2006.01)

(52) U.S. Cl. .................. 438/26; 438/116; 257/99; 257/433; 257/E51.018

(58) Field of Classification Search ............ None
See application file for complete search history.

(56) References Cited

U.S. PATENT DOCUMENTS

| | | | |
|---|---|---|---|
| 5,087,964 A | 2/1992 | Hatta | |
| 5,161,009 A | 11/1992 | Tanoi et al. | |
| 5,266,828 A | 11/1993 | Nakamura et al. | |
| 5,352,852 A | 10/1994 | Chun | |
| 5,463,229 A | 10/1995 | Takase et al. | |
| 5,598,033 A | 1/1997 | Behlen et al. | |
| 5,608,262 A | 3/1997 | Degani et al. | |
| 5,786,589 A | 7/1998 | Segawa et al. | |
| 5,867,368 A | 2/1999 | Glenn | |
| 6,144,507 A | 11/2000 | Hashimoto | |
| 6,255,769 B1 | 7/2001 | Cathey et al. | |
| 6,342,406 B1 | 1/2002 | Glenn et al. | |
| 6,396,043 B1 | 5/2002 | Glenn et al. | |
| 6,400,075 B1 | 6/2002 | Watkins et al. | |
| 6,472,761 B1 | 10/2002 | Nakamura | |
| 6,538,322 B1 | 3/2003 | Nakamura | |

(Continued)

FOREIGN PATENT DOCUMENTS

EP 0 460 668 A2 12/1991

(Continued)

*Primary Examiner*—Alonzo Chamblis
(74) *Attorney, Agent, or Firm*—TraskBritt

(57) ABSTRACT

The present invention provides flip-chip packaging for optically interactive devices such as image sensors and methods of assembly. In a first embodiment of the invention, conductive traces are formed directly on the second surface of a transparent substrate and an image sensor chip is bonded to the conductive traces. Discrete conductive elements are attached to the conductive traces and extend below a back surface of the image sensor chip. In a second embodiment, a secondary substrate having conductive traces formed thereon is secured to the transparent substrate. In a third embodiment, a backing cap having a full array of attachment pads is attached to the transparent substrate of the first embodiment or the secondary substrate of the second embodiment. In a fourth embodiment, the secondary substrate is a flex circuit having a mounting portion secured to the second surface of the transparent substrate and a backing portion bent over adjacent to the back surface of the image sensor chip.

13 Claims, 10 Drawing Sheets

U.S. PATENT DOCUMENTS

| | | |
|---|---|---|
| 6,566,745 B1 * | 5/2003 | Beyne et al. ............... 257/680 |
| 6,571,466 B1 | 6/2003 | Glenn et al. |
| 6,646,335 B1 | 11/2003 | Emoto |
| 6,656,768 B1 | 12/2003 | Thomas |
| 6,765,288 B1 | 7/2004 | Damberg |
| 6,864,116 B1 | 3/2005 | Kim et al. |
| 6,885,107 B1 * | 4/2005 | Kinsman ................... 257/778 |
| 6,964,886 B1 * | 11/2005 | Kinsman ................... 438/125 |
| 2002/0043706 A1 | 4/2002 | Jerominek et al. |
| 2002/0089044 A1 | 7/2002 | Simmons et al. |
| 2002/0093078 A1 | 7/2002 | Paek |

FOREIGN PATENT DOCUMENTS

| | | |
|---|---|---|
| JP | 02-278872 | 11/1990 |
| JP | 2000307055 A | 11/2000 |

* cited by examiner

METHODS OF FABRICATION FOR FLIP-CHIP IMAGE SENSOR PACKAGES

CROSS-REFERENCE TO RELATED APPLICATIONS

This application is a divisional of application Ser. No. 10/375,864, filed Feb. 26, 2003, now U.S. Pat. No. 6,964,886, issued Nov. 15, 2005, which is a divisional of application Ser. No. 10/230,654, filed Aug. 29, 2002, now U.S. Pat. No. 6,885,107, issued Apr. 26, 2005.

BACKGROUND OF THE INVENTION

1. Field of the Invention

The present invention relates to packaging for optically interactive electronic devices. More particularly, the present invention relates to a package for a solid-state image sensor particularly suitable for high input/output (I/O) count devices wherein an image sensor chip is mounted in flip-chip fashion to a transparent substrate or to a secondary substrate secured to the transparent substrate.

2. State of the Art

Optically interactive electronic devices, for example, charge coupled device (CCD) image sensors or complementary metal-oxide semiconductor (CMOS) image sensors, are typically packaged within a housing for subsequent connection to higher-level packaging such as a larger circuit assembly in the form of a carrier substrate. The housing provides electrical interconnection to the larger circuit assembly, provides protection from the surrounding environment and allows light or other forms of radiation to pass through to sensing circuitry located on the image sensor device. In the prior art, package formation has often been accomplished by placing an image sensor device in the form of a semiconductor chip into the cavity of a plastic or ceramic housing, wire bonding electrical connection points on the semiconductor chip to conductive pads associated with the housing and sealing a window or transparent cover over the cavity. The materials and structure involved with this packaging technique require a fabrication process that can be time consuming and requires several precision assembly steps. Wire bonding, for instance, involves special considerations during package formation due to the fragile nature of bond wires and their associated connection points, and also may call for excessive package depth or thickness in order to accommodate the arched wire bond loops within the package cavity. Further, each assembly step increases the opportunity for contamination or damage to the image sensor device itself, raising defect levels and slowing production time to avoid such damage and contamination. Due to the extremely cost-competitive nature of today's semiconductor industry, even small improvements in product yield and production time are of value, especially when considered in terms of the high volume of components being manufactured.

In response to the above-noted shortcomings of the existing packaging techniques, various structures using flip-chip mounting of an image sensor chip have been developed in an attempt to simplify the construction of image sensor packages. U.S. Pat. No. 6,144,507 to Hashimoto and U.S. Pat. No. 5,867,368 to Glenn, for example, each disclose an image sensor chip mounted directly to a printed circuit board (PCB). An image sensor chip is mounted in flip-chip fashion over an aperture within the PCB, and a transparent cover is either attached directly to the active surface of the chip or bonded to the side of the PCB opposite that to which the image sensor chip is attached and over the aperture. Although these methods eliminate the difficulties associated with wire bonding and forming a housing for the image sensor chip, the illustrated PCBs are very large with respect to the size of the image sensor chip and the transparent cover. It is unclear from the aforementioned patents whether the PCBs comprise discrete image sensor packages suitable for attachment to a larger circuit assembly, or themselves comprise large circuit assemblies simply having an image sensor chip mounted directly thereto, without the benefit of a package or housing.

Another packaging approach has been to use the transparent cover itself as a foundation for an image sensor package. U.S. Pat. No. 5,786,589 to Segawa et al. uses this approach by adhesively bonding a TAB sheet to a glass substrate and bonding an image sensor chip to the TAB tape with an anisotropically conductive film. This design requires a specialized substrate attachment technique due to the TAB-type connection leads. Moreover, the conductive film risks interference with sensing circuitry on the image sensor chip and requires the formation of dummy leads or dam structures to compensate for this problem. U.S. Pat. No. 6,342,406 to Glenn et al. and U.S. Pat. No. 5,352,852 to Chun each bond an image sensor chip to a transparent substrate by forming conductive traces directly on the substrate. Glenn et al., however, uses a ball mounting arrangement on the first surface of the transparent substrate that requires the formation of vias through the substrate to connect interior and exterior traces formed thereon. The arrangement also requires an aperture be formed within any substrate carrying the package to provide optical access to the active surface of the image sensor chip, as the image sensor active surface faces the attachment side of the package. Chun uses a lead arrangement that requires the package to be mounted within a substrate mounting depression or the addition of outleads which may be susceptible to damage during package handling and may not be suitable for high I/O sensor devices. Chun further requires the use of a frame of insulating tape to space the image sensor chip from the interior of the transparent substrate.

As is evident from the foregoing review of the current state of the art in image sensor packaging, a need exists for an improved image sensor packaging structure that is simple to fabricate, suitable for use with high I/O sensor devices, durable and easily mounted to a larger circuit assembly without the use of special substrate apertures or depressions.

SUMMARY OF THE INVENTION

In accordance with the present invention, image sensor packaging having the above-described and other beneficial characteristics and methods for fabrication thereof are provided. An image sensor chip is flip-chip mounted to conductive traces on a first surface of a transparent substrate. The active surface of the image sensor chip is protected from contamination after mounting by depositing a bead of sealant around the periphery of the image sensor chip between the active surface of the image sensor chip and the first surface of the substrate, thus eliminating any need for additional damming structures or spacing frames as used in the prior art. Discrete conductive elements such as solder balls or columns are attached to ends of the conductive traces which form an array pattern, the discrete conductive elements extending transversely from the conductive traces on the first surface to a substantially common plane at a level beyond a back surface of the image sensor chip. The resulting structure comprises a board-over-chip (BOC)

package arrangement that provides high I/O connectivity for the image sensor chip and is easily mounted to a carrier substrate such as a printed circuit board (PCB) without requiring the formation of special apertures therein.

In a first exemplary embodiment of the present invention, conductive traces are formed directly on the first surface of the transparent substrate and an image sensor chip is flip-chip mounted to first attachment points of the conductive traces. The conductive traces extend beyond the periphery of the image sensor chip, and discrete conductive elements are joined to or formed on second attachment points of the conductive traces in an array pattern around the image sensor chip.

In a second exemplary embodiment of the present invention, a secondary substrate having the conductive traces formed thereon is secured to the first surface of the transparent substrate. An image sensor chip is flip-chip mounted to first attachment points of the conductive traces. The conductive traces extend beyond the periphery of the image sensor chip and discrete conductive elements are formed in an array pattern as in the first exemplary embodiment.

In a third exemplary embodiment of the present invention, a backing cap is placed over the back surface of the image sensor chip. The side of the backing cap facing toward the image sensor chip carries contacts placed in electrical communication with the conductive traces formed on the transparent substrate or the secondary substrate which are, in turn, in electrical communication with the image sensor chip. Because the backing cap covers the back surface of the image sensor chip, discrete conductive elements for connection to external circuitry may be formed in a full array pattern including the area underneath the image sensor chip.

In a fourth exemplary embodiment of the present invention, the secondary substrate secured to the transparent substrate is in the form of a flex circuit having the conductive traces formed thereon. The flex circuit includes a backing portion that is folded over the back surface of the image sensor chip. The backing portion has discrete conductive elements formed in a full array pattern as in the third exemplary embodiment.

In a further variation to any of the above-described package embodiments, an array of image sensor packages may be simultaneously formed on one large transparent substrate, which is then cut or otherwise divided or singulated to form multiple individual image sensor packages.

Other and further features and advantages of the present invention will be apparent from the following descriptions of the various exemplary embodiments read in conjunction with the accompanying drawings. It will be understood by one of ordinary skill in the art that the following are provided for illustrative and exemplary purposes only, and that numerous combinations of the elements of the various embodiments of the present invention are contemplated as within the scope of the present invention.

BRIEF DESCRIPTION OF THE SEVERAL VIEWS OF THE DRAWINGS

In the drawings, which illustrate what is currently considered to be the best mode for carrying out the invention.

DETAILED DESCRIPTION OF THE INVENTION

Figure 1:
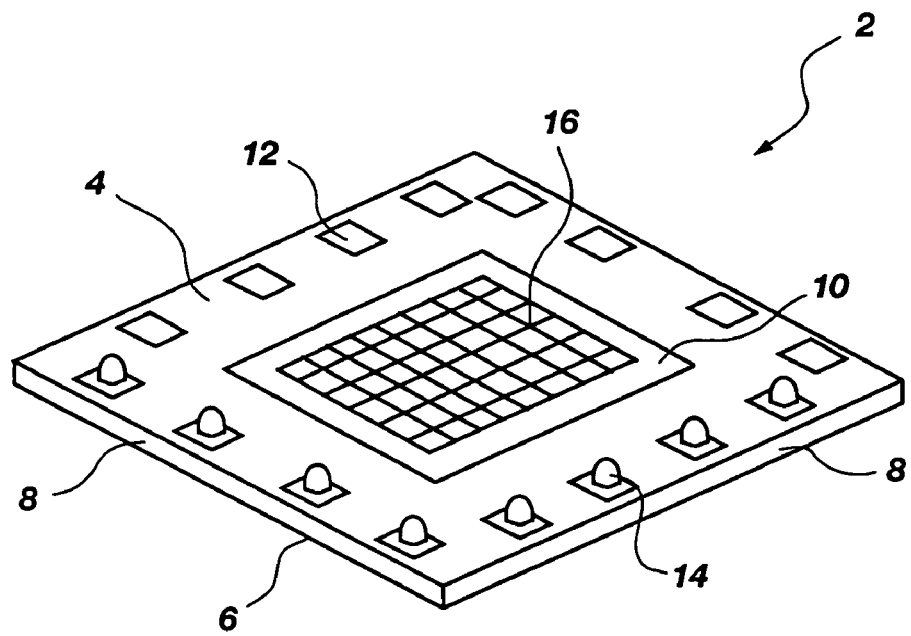
FIG. 1 is a perspective view showing an image sensor chip contained within image sensor packaging according to the present invention.

Referring in general to the accompanying drawings, various aspects of the present invention are illustrated to show the structure and methods for assembly of an image sensor package formed on a transparent substrate. Common elements and features of the illustrated embodiments are designated by the same or similar reference numerals. It should be understood that the figures presented are not meant to be illustrative of actual views of any particular portion of the actual device structure, but are merely idealized schematic representations which are employed to more clearly and fully depict the invention. It should further be understood that, while depicted in terms of an image sensor, the package embodiments and methods presented herein would work well for other types of optically interactive electronic devices. The term "optically interactive" as used herein encompasses devices sensitive to various wavelengths of light or other forms of radiation, such as, but not limited to, CCD and CMOS image sensors, EPROMs, and photodiodes, as well as light-emitting devices such as semiconductor lasers and light-emitting diodes.

FIG. 1 shows a perspective view of an exemplary image sensor chip 2 suitable for use with the various embodiments of the present invention. Image sensor chip 2 includes an active surface 4 and a back surface 6. Active surface 4 and back surface 6 are bounded by sides 8, also termed the "periphery" of image sensor chip 2. Active surface 4 includes sensing circuitry 10 in a central portion and bond pads 12 formed outwardly of sensing circuitry 10 and around the perimeter of active surface 4. As used herein, the term "bond pads" includes not only bond pads directly connected to underlying sensing circuitry 10 but also bond pad locations removed from original locations using a redistribution layer extending over active surface 4 as known in the art. Bond pads 12 are depicted in a single row along each of the four sides 8 of image sensor chip 2, but other arrangements are possible, for example and not by way of limitation, having bond pads 12 formed along fewer sides or in multiple rows along one or more sides. If multiple rows are used, the bond pads 12 of one row may be staggered or offset from those of an adjacent row. Conductive bumps 14 (only some shown by way of example) are formed on bond pads 12 to enable flip-chip attachment of image sensor chip 2 and will be described in further detail below. For certain types of image sensors, micro-lenses 16 may be formed over sensing circuitry 10 to aid in the reception of light.

Figure 2:
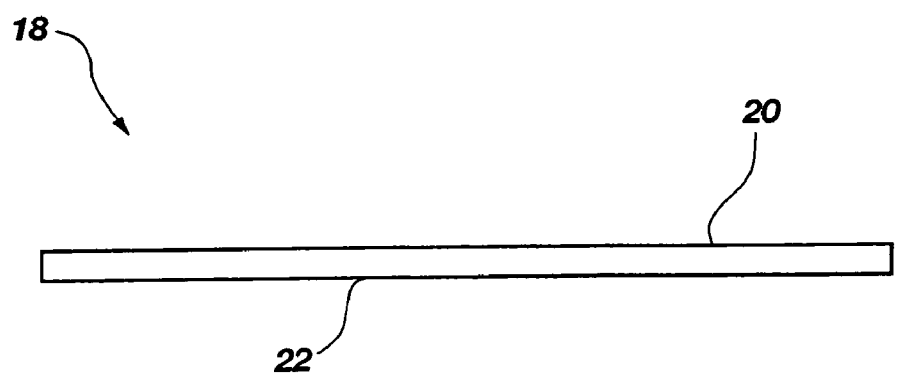
FIG. 2 is a side view showing a transparent substrate according to the present invention.

FIG. 2 shows a side view of an exemplary transparent substrate 18 serving as the primary package structure for the various embodiments of the present invention. Transparent substrate 18 includes a first surface 20 and a second surface 22. Transparent substrate 18 may be formed of glass, plastic or any other substrate material that is suitably transmissive of light or other forms of radiation. Accordingly, the term "transparent" is not used in its literal sense, but is descriptive of a substrate material exhibiting sufficient transmissivity of light at selected wavelengths sufficient for operation of image sensor chip 2. A plate of borosilicate glass is one specific, and currently preferred, example of a suitable material for transparent substrate 18. Transparent substrate 18 may also provide an auxiliary optical function, for instance, by forming first surface 20 into a lens, grating or other suitable configuration to provide light focusing, refraction or dispersion capabilities or by using a material for or coating of transparent substrate 18 that prevents selected wavelengths of light from passing therethrough to sensing circuitry 10.

Figure 3:
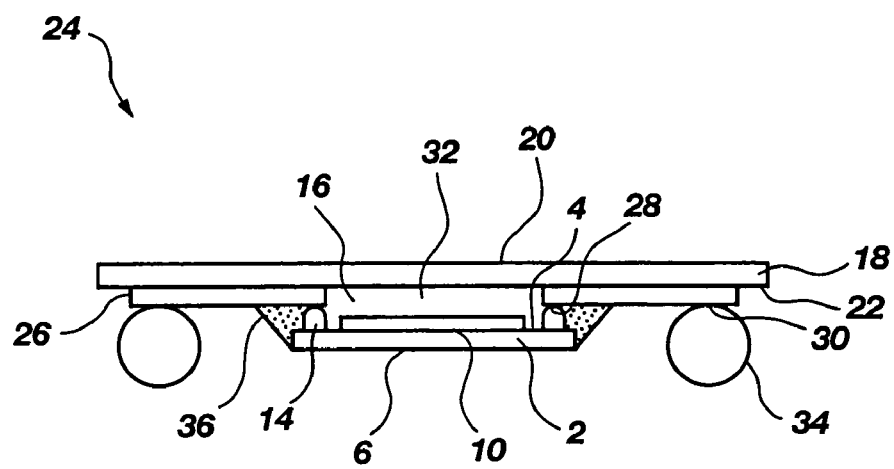
FIG. 3 is a sectional side view showing an image sensor package according to a first embodiment of the present invention.
Figure 4:
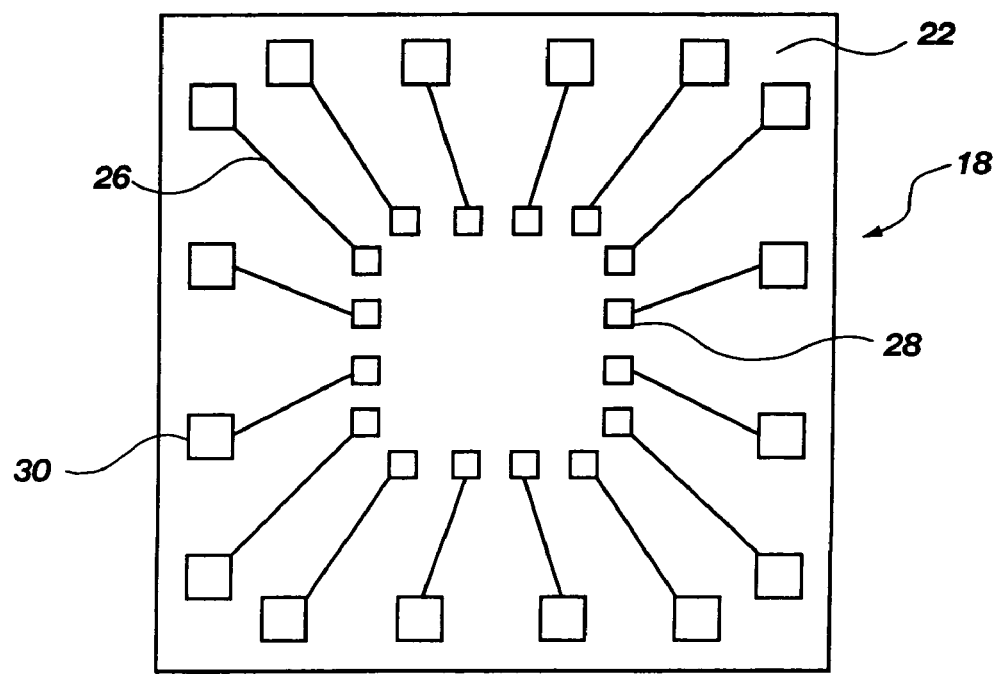
FIG. 4 is an underside view showing a second surface of a transparent substrate for the image sensor package depicted in FIG. 3.

Turning to FIGS. 3 through 6, a first embodiment according to the present invention is illustrated. FIG. 3 shows a sectional side view of an image sensor package 24 wherein conductive traces 26 (thickness enlarged for clarity) are formed directly on second surface 22 of transparent substrate 18. As seen in FIG. 4, which is an underside plan view of second surface 22 as oriented in FIG. 3, conductive traces 26 have first attachment points 28 formed at locations around the center of transparent substrate 18 and corresponding to the spacing of bond pads 12 (FIG. 1) on image sensor chip 2. Spreading out from the center of transparent substrate 18, conductive traces 26 have second attachment points 30 formed in an array pattern. For purposes of illustration, second attachment points 30 have been depicted in a single row running around the center and proximate the periphery of transparent substrate 18. It should be understood, however, that the number of rows employed may be based on factors such as the number and arrangement of bonds pads 12 on image sensor chip 2, and may comprise several rows of second attachment points 30. Conductive traces 26 may be formed on second surface 22 of transparent substrate 18 using a variety of techniques. For instance, a conductive or conductor-filled liquid epoxy or resin could be printed, screen-printed or otherwise dispensed onto second surface 22 in the desired pattern and then cured to form conductive traces 26. Alternatively, a layer of conductive material such as metal or doped silicon may be formed over the entirety of second surface 22, and then selectively etched to form conductive traces 26. As yet another approach, adhesively coated preformed traces carried by a removable backing layer may be applied to transparent substrate 18 and then the backing layer removed.

Returning to FIG. 3, an image sensor chip 2 is flip-chip mounted to first attachment points 28 by bonding with conductive bumps 14 such that sensing circuitry 10 on active surface 4 is exposed through the central portion of transparent substrate 18. The term "bumps" includes, without limitation, conductive structures configured as balls, bumps, columns, pillars and studs. In the various embodiments of the present invention, conductive bumps 14 are formed of materials known in the art for use in flip-chip bonding. Suitable materials may include, but are not limited to, conductive or conductor-filled epoxy, eutectic tin/lead solder and gold. Conductive bumps 14 may be formed of one material, not necessarily conductive, and coated with another. Alternatively, a strip or segment of an anisotropically conductive adhesive film may be employed in lieu of a plurality of conductive bumps 14. In the case where sensing circuitry 10 is covered by micro-lenses 16, conductive bumps 14 are formed to a sufficient thickness so as to leave a vertical gap 32 between micro-lenses 16 and second surface 22 to enable micro-lenses 16 to properly receive light through transparent substrate 18.

FIG. 3 further shows discrete conductive elements 34 attached to second attachment points 30 and extending downwardly from transparent substrate 18 to a plane at a level below back surface 6 of image sensor chip 2. By extending beyond the back surface 6 of image sensor chip 2, discrete conductive elements 34 enable image sensor package 24 to be mounted to a carrier substrate 38 (FIG. 5) without the need for a depression or cavity within the surface of carrier substrate 38 to accommodate image sensor chip 2. Moreover, since discrete conductive elements 34 interface with carrier substrate 38 below or "behind" image sensor package 24, active surface 4 of image sensor chip 2 faces outwardly. Therefore, an aperture is not required within carrier substrate 38 to expose active surface 4. In a presently preferred embodiment, discrete conductive elements 34 are structures that extend downwardly in a direction perpendicular to the plane of second surface 22, such as solder balls or columns. These structures are less susceptible to damage during handling than the lead arrangements used in prior art packaging. They may also be formed in multiple rows, making them more suitable for packaging of high I/O devices. The solder balls or columns may be formed entirely of a eutectic tin/lead solder, or may have a solid metal core surrounded by solder. Forming discrete conductive elements of other materials such as conductive or conductor-filled epoxy or anisotropically conductive materials is also within the scope of the present invention, as long as they can be sized and configured to meet the desired height and pitch requirements.

A bead of sealant 36 is deposited around the sides 8 or periphery of image sensor chip 2 and contacts second surface 22 of transparent substrate 18. Sealant 36 protects active surface 4 of image sensor chip 2 from outside environmental damage and further mechanically secures the integrity of the flip-chip bonds extending between bond pads 12 of image sensor chip 2 and conductive traces 26 of transparent substrate 18. Because sealant 36 is placed around the periphery of active surface 4 after attachment of image sensor chip 2, there is no need for additional damming structures or spacing frames which complicate the fabrication process. Nonexhaustive examples of suitable sealant 36 material include a viscous liquid or gelled epoxy or silicone deposited around image sensor chip 2 and cured in place.

Figure 5:
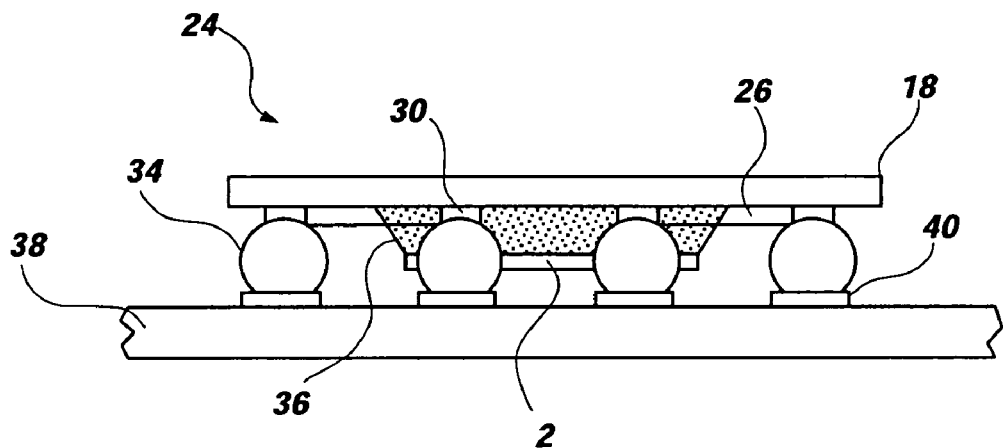
FIG. 5 is a side view showing the image sensor package depicted in FIG. 3 mounted to a carrier substrate.

FIG. 5 shows a side view of image sensor package 24 mounted to carrier substrate 38, wherein discrete conductive elements 34 are formed as solder balls which have been reflowed to bond to conductive terminal pads 40 on the surface of carrier substrate 38.

Figure 6:
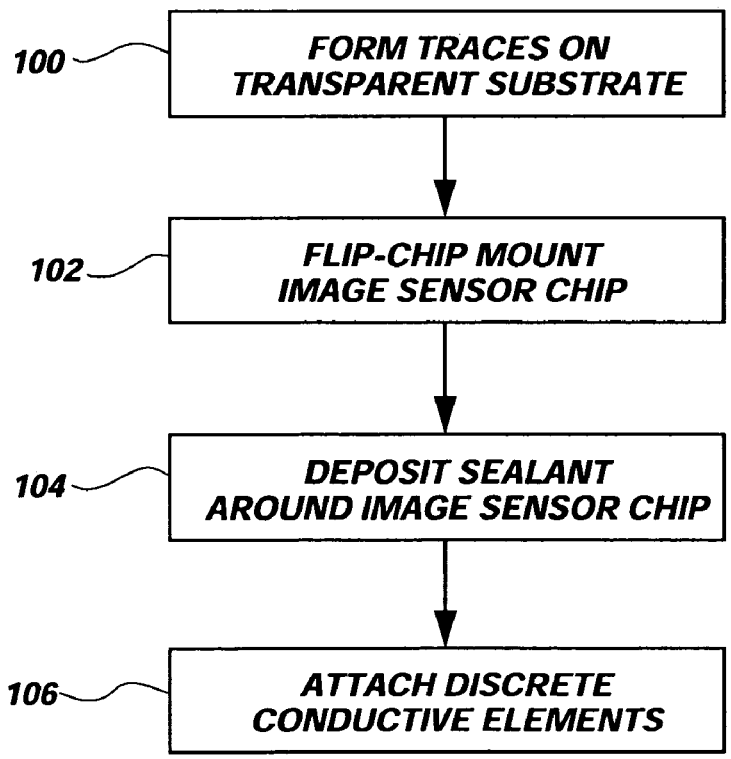
FIG. 6 is a flow chart showing a method of fabrication according to the first embodiment of the present invention.

FIG. 6 shows a flow chart of an exemplary method of fabrication for the first embodiment of the present invention. First, in action 100, conductive traces 26 are formed on second surface 22 of transparent substrate 18. In action 102, image sensor chip 2 is flip-chip mounted by bonding conductive bumps 14 to first attachment points 28. Next, in action 104, a bead of sealant is deposited around image sensor chip 2, contacting sides 8 and transparent substrate 18. Finally, in action 106, discrete conductive elements 34 are formed on or attached to second attachment points 30, and image sensor package 24 is completed.

Figure 7:
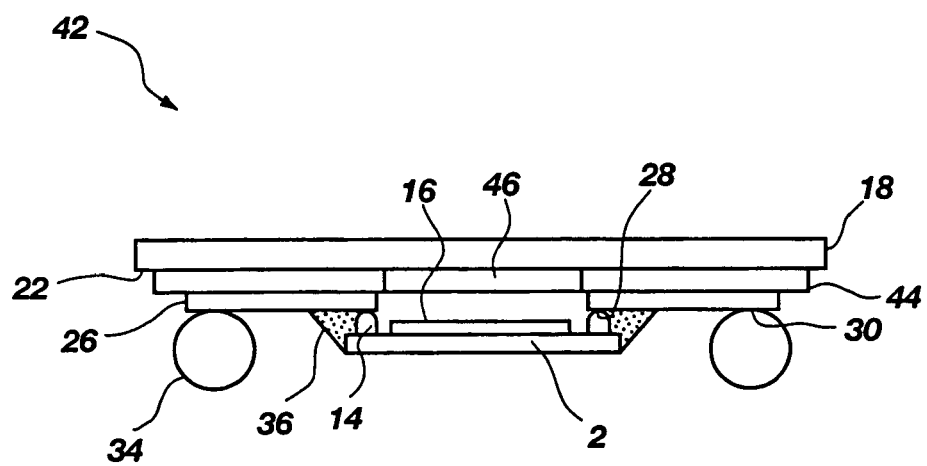
FIG. 7 is a sectional side view showing an image sensor package according to a second embodiment of the present invention.
Figure 8:
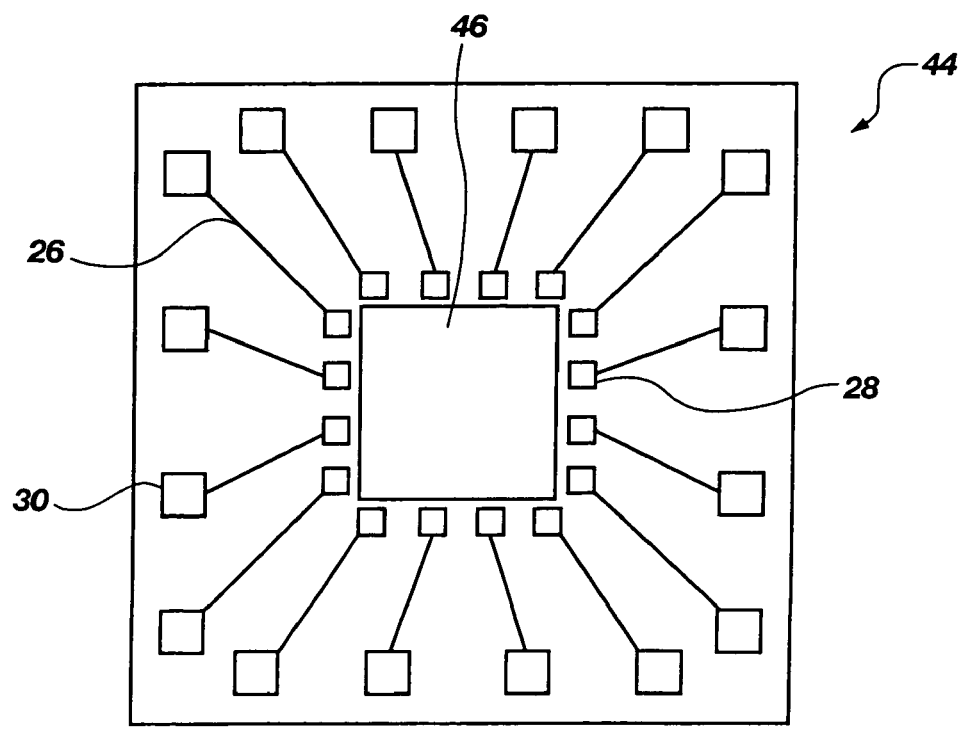
FIG. 8 is a plan, underside view showing a secondary substrate for the image sensor package depicted in FIG. 7.
Figure 9:
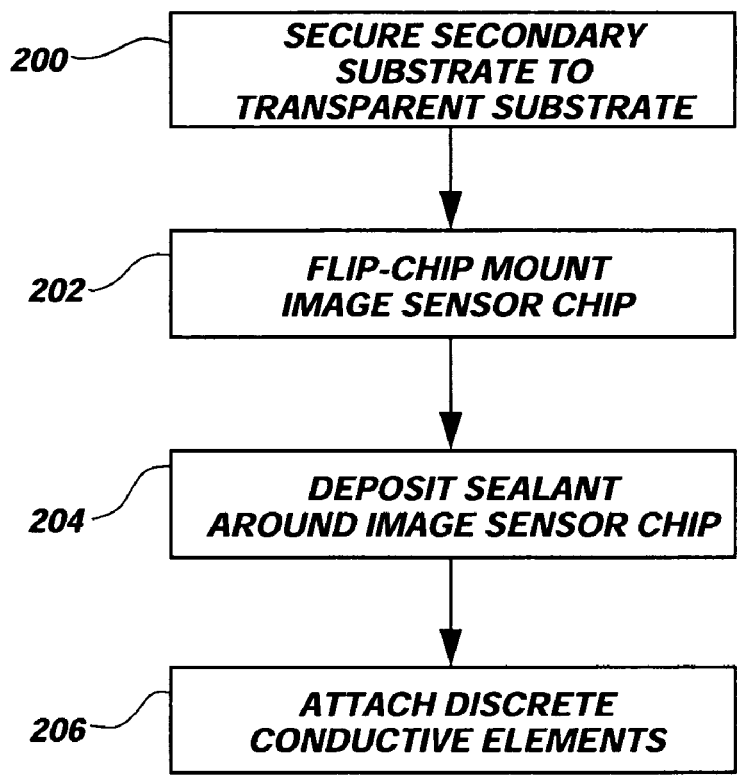
FIG. 9 is a flow chart showing a method of fabrication according to the second embodiment of the present invention.

A second embodiment according to the present invention is illustrated in FIGS. 7 through 9. FIG. 7 shows a sectional side view of an image sensor package 42. A secondary substrate 44 having aperture 46 and conductive traces 26 (enlarged for clarity) formed thereon is secured to second surface 22 of the transparent substrate 18, and image sensor chip 2 is flip-chip mounted to secondary substrate 44. Secondary substrate 44 may be, for example, a PCB formed of an FR-4 or FR-5 laminate, a BT epoxy resin, a ceramic, or silicon with conductive traces 26 formed thereon by conventional PCB fabrication techniques, such as the aforementioned printing, etching, etc. The secondary substrate 44 is then secured to transparent substrate 18 such as with an adhesive material applied to the PCB and/or transparent substrate 18. Alternatively, secondary substrate 44 may be formed of a polymer film such as a polyimide having conductive traces formed on one side and an adhesive coating on the opposite side for securing to transparent substrate 18. A pressure-sensitive, heat or light-curable adhesive may be employed. Nonadhesive bonding, such as heat bonding, of secondary substrate 44 to transparent substrate 18 may be employed with suitable materials.

As seen in FIG. 8, which is a plan underside view of secondary substrate 44, conductive traces 26 have first attachment points 28 and second attachment points 30, and spread out from aperture 46 in a pattern similar to that of the first embodiment. While depicted as being on an outside surface of secondary substrate 44 facing image sensor chip 2, conductive traces 26 may reside within secondary substrate 44 or be located on the opposite side thereof and include interlevel connections (vias) respectively extending to the first and second attachment points 28 and 30. Conductive bumps 14 on image sensor chip 2 are bonded to first attachment points 28 such that sensing circuitry 10 is exposed through aperture 46. Discrete conductive elements 34 having the same structure as in the first embodiment are attached to second attachment points 30. A bead of sealant 36 is also deposited around the sides 8 of image sensor chip 2, but sealant 36 contacts secondary substrate 44 rather than transparent substrate 18 as in the first embodiment.

FIG. 9 shows a flow chart of an exemplary method of fabrication for the second embodiment of the present invention. First, in action 200, secondary substrate 44 having aperture 46 and conductive traces 26 is adhesively secured to transparent substrate 18. In action 202, image sensor chip 2 is flip-chip mounted by bonding conductive bumps 14 to first attachment points 28. Next, in action 204, a bead of sealant 36 is deposited around image sensor chip 2, contacting sides 8 and secondary substrate 44. Finally, in action 206, discrete conductive elements 34 are formed on or attached to second attachment points 30, and image sensor package 42 is completed.

Figure 10:
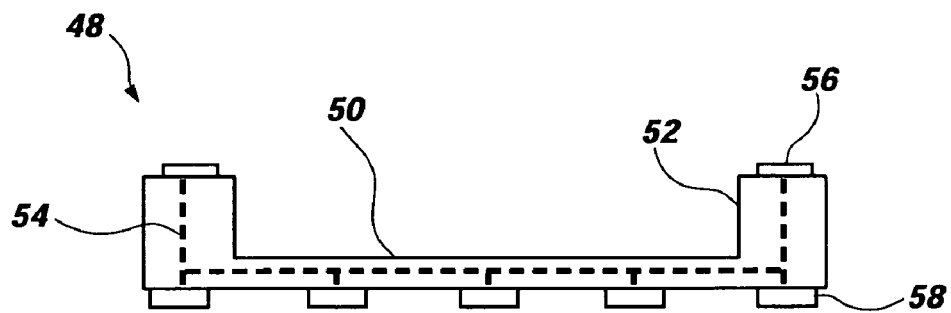
FIG. 10 is a sectional side view showing a backing cap for an image sensor package according to a third embodiment of the present invention.

For image sensor devices with higher I/O requirements, a full array pattern of discrete conductive elements may be desirable for attaching an image sensor package to a carrier substrate. Turning to FIGS. 10 through 13, a third embodiment of the present invention providing a full array pattern is illustrated. FIG. 10 shows a sectional side view of a backing cap 48 that is constructed to extend over back surface 6 and sides 8 of image sensor chip 2. Backing cap 48 includes base 50 and sidewalls 52 around and extending transversely from the perimeter of base 50. Base 50 and sidewalls 52 may be formed, for example, of conventional PCB materials such as glass-reinforced fiber, polymeric or ceramic materials. Conductive lines 54 extend through backing cap 48 from attachment points 56 exposed on sidewalls 52 to attachment pads 58 exposed on base 50. Because attachment pads 58 are formed on base 50, they may be arranged in a fully populated array across the entire area of "footprint" of the image sensor package, providing more I/O interfaces for a sensor device contained therein.

Figure 11:
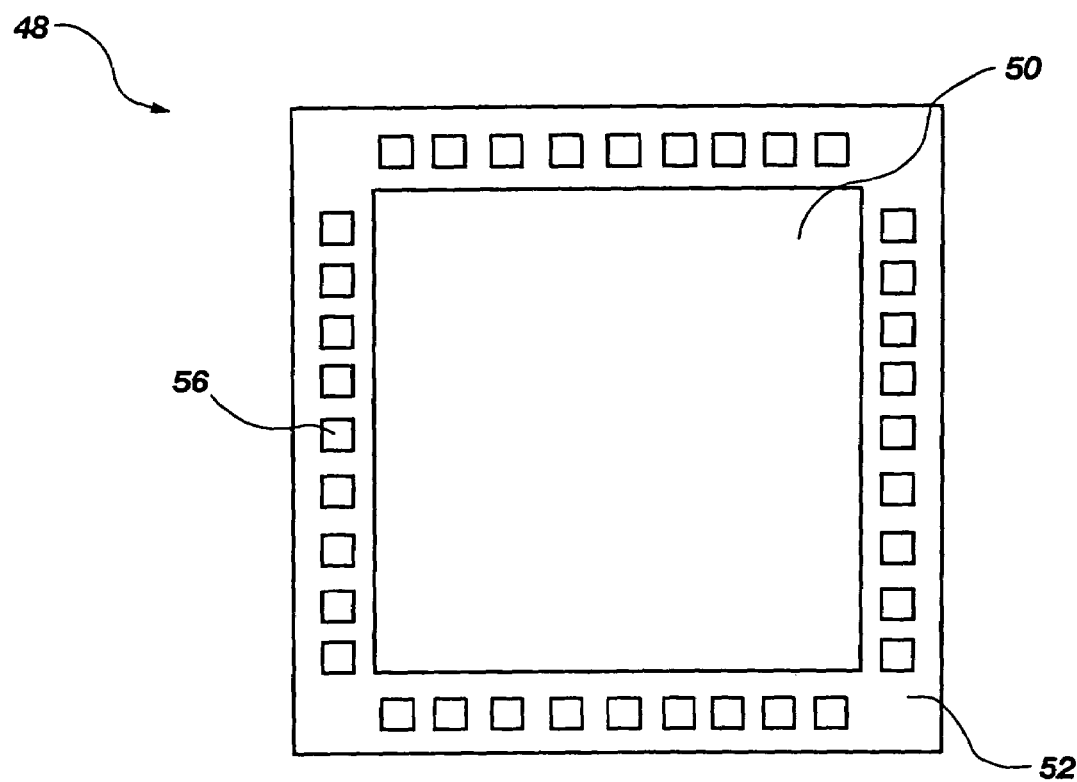
FIG. 11 is a top plan view of the backing cap depicted in FIG. 10.

Backing cap 48 may be used in combination with elements of both image sensor package 24 of the first embodiment and image sensor package 42 of the second embodiment. Rather than attaching discrete conductive elements 34 to second attachment points 30, backing cap attachment points 56 may be bonded to second attachment points 30 of conductive traces 26 for electrical communication with attachment pads 58. Second attachment points 30 and backing cap attachment points 56 may be bonded in a variety of ways, such as by application of conductive or conductor-filled epoxy or by forming a solder joint between the two. A frame comprising a film of anisotropically conductive adhesive material may also be applied between sidewalls 52 and transparent substrate 18 or secondary substrate 44, depending on the image sensor package embodiment elements used with backing cap 48. This approach electrically connects and bonds second attachment points 30 and backing cap attachment points 56, and further acts to seal backing cap 48 into place. With the third embodiment, second attachment points 30 may be formed much smaller than in the first two embodiments, as they are not required to support the formation of discrete conductive elements 34. Accordingly, an increased number of second attachment points 30 may be patterned around the outside of image sensor chip 2 for bonding with a corresponding number of backing cap attachment points 56. This makes it possible to electrically communicate with a fully populated array of attachment pads 58 for higher I/O connectivity. FIG. 11 shows a top plan view of backing cap 48 with an exemplary single row pattern of backing cap attachment points 56. It should also be noted that conductive lines 54 may be formed to extend from backing cap attachment points 56 and around the exterior of sidewalls 52 and over the back surface of base 50 to attachment pads 58. Similarly, for simplicity, the portions of conductive lines 54 extending through sidewalls 52 may comprise vias leading to a redistribution layer of conductive traces formed over the back surface of base 50.

Figure 12:
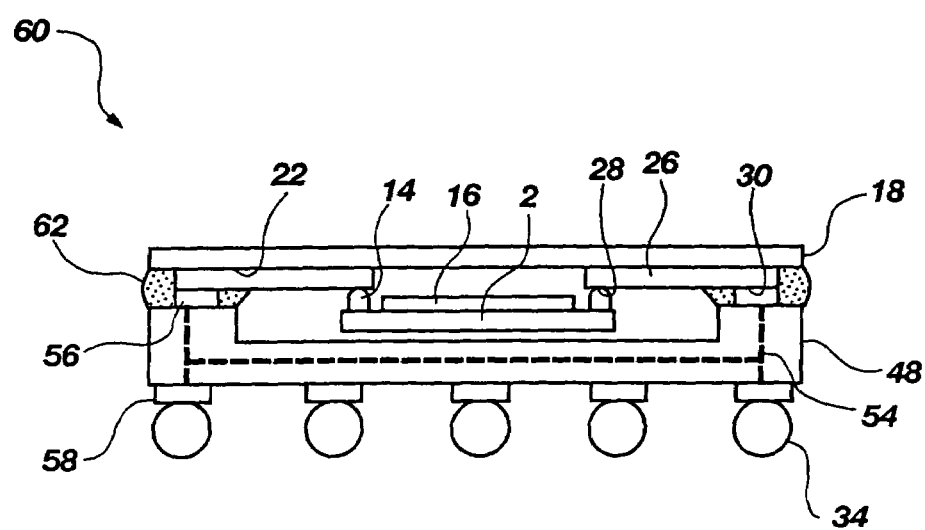
FIG. 12 is a sectional side view showing an image sensor package according to the third embodiment of the present invention.

FIG. 12 shows a sectional side view of an image sensor package 60 according to the third embodiment of the present invention using a transparent substrate 18 with conductive traces 26 formed directly on second surface 22, as in the first embodiment. After electrical connection is made between backing cap attachment points 56 and second attachment points 30 of conductive traces 26, backing cap 48 is sealed to transparent substrate 18 with a layer or bead of dielectric adhesive 62. Alternatively, and as previously noted, an anisotropically conductive adhesive may be used to both electrically bond second attachment points 30 and backing cap attachment points 56 and seal between backing cap 48 and transparent substrate 18. Discrete conductive elements 34 are attached to or formed on attachment pads 58. Discrete conductive elements 34 may be formed as structures and of materials similar to those described in conjunction with the first and second embodiments of the present invention, but will not require as large a height as they are already located at a point below image sensor chip 2. Alternatively, since attachment pads 58 reside on a plane on the second surface of image sensor package 60, discrete conductive elements 34 may be omitted and attachment pads 58 directly attached to conductive terminal pads 40 on carrier substrate 38 in a land-grid array-type arrangement.

Figure 13:
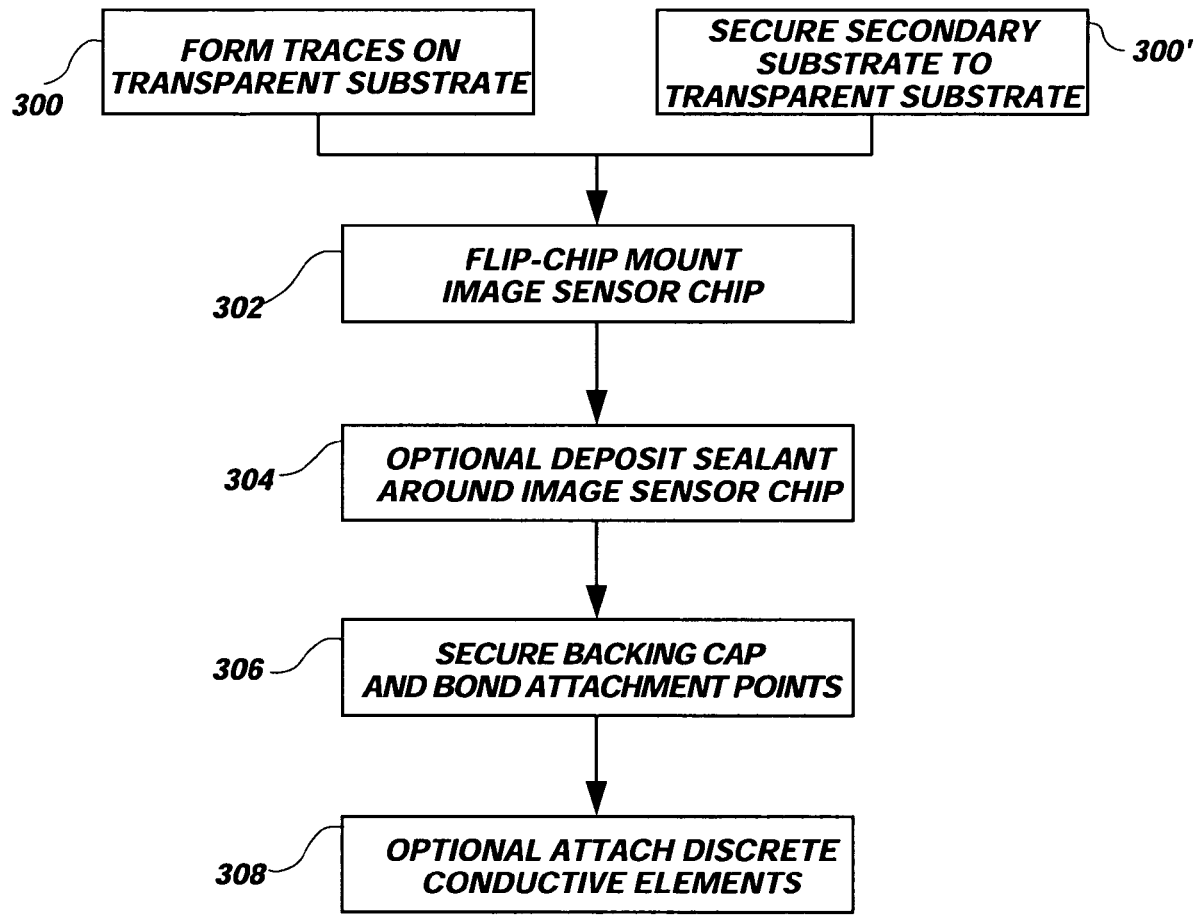
FIG. 13 is a flow chart showing a method of fabrication according to the third embodiment of the present invention.

FIG. 13 shows a flow chart of an exemplary method of fabrication for the third embodiment of the present invention. First, in action 300, conductive traces 26 are formed on second surface 22 of transparent substrate 18 when using the packaging structure of the first embodiment. Alternatively, in action 300', secondary substrate 44 having aperture 46 and conductive traces 26 is adhesively secured to transparent substrate 18 when using the packaging structure of the second embodiment. In action 302, image sensor chip 2 is flip-chip mounted by bonding conductive bumps 14 to first attachment points 28. In action 304, a bead of sealant is deposited around image sensor chip 2, contacting sides 8 and transparent substrate 18 or secondary substrate 44 depending on the package structure used. Because image sensor chip 2 will be covered and sealed by backing cap 48, the sealant of action 304 may optionally be, and preferably is, omitted. Next, in action 306, backing cap 48 is secured in place and second attachment points 30 and backing cap attachment points 56 are bonded for electrical communication. Finally, in action 308, if a land-grid array-type package is not desired, discrete conductive elements 34 are formed on or attached to the full array of attachment pads 58.

Figure 14A:
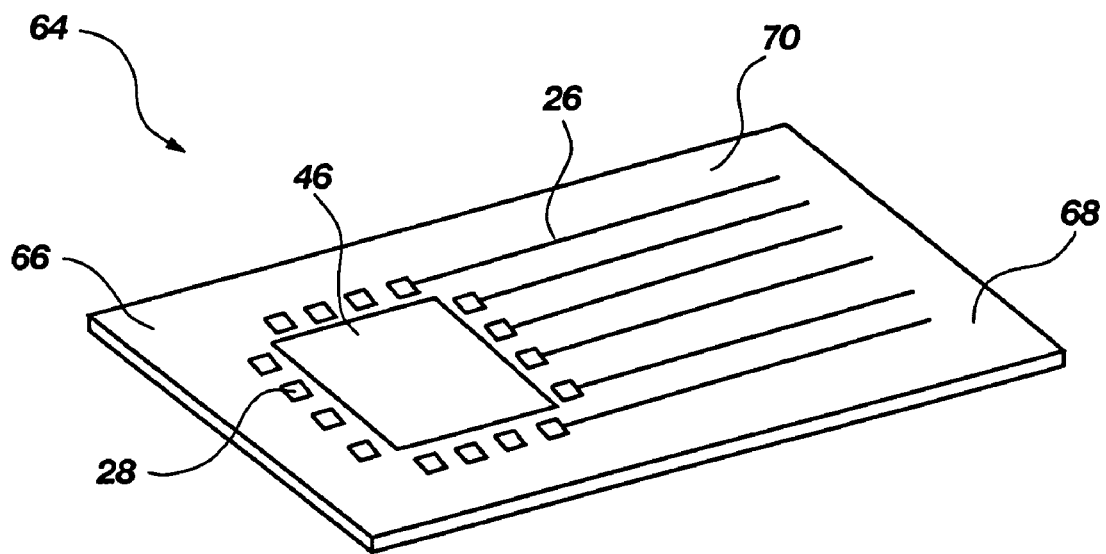
FIGS. 14A and 14B are perspective views showing a flex circuit according to a fourth embodiment of the present invention.

A fourth embodiment of the present invention that is also capable of providing a full array of I/O interfaces is illustrated in FIGS. 14A through 16. The fourth embodiment of the present invention is a variation of the second embodiment, wherein secondary substrate 44 is in the form of a flex circuit 64 having conductive traces 26 formed thereon. Flex circuit 64 is constructed of conventional flexible-circuit materials such as a flexible polyimide film having conductive traces 26 formed on or within the film. As used herein, the term "flexible" means any substrate material that may be substantially bent over itself or folded without causing substantial damage to the flex circuit and specifically the conductive traces 26 thereof. FIGS. 14A and 14B show exemplary second and first surface perspective views of flex circuit 64. Flex circuit 64 includes a mounting portion 66 and a backing portion 68. Mounting portion 66 includes aperture 46 as in the second embodiment. First attachment points 28 of conductive traces 26 are patterned around aperture 46 on a first side 70 of flex circuit 64. However, rather than forming second attachment points 30 in a pattern around aperture 46, conductive traces 26 (only some shown for clarity) extend onto backing portion 68 through vias (see vias 27 in broken lines in FIGS. 15A and 15B) and second attachment points 30 are formed in a fully populated array pattern on a second side 72 of flex circuit 64. It should be understood that conductive traces 26, while being depicted as straight lines in FIG. 14A for the purposes of illustration, would be routed such that each conductive trace 26 would terminate at a separate second attachment point 30 on second side 72. Vias 27 may be etched into flex circuit 64, filled by electroless or electroplating, or filled with a conductive or conductor-filled polymer, after which second attachment points 30 are formed thereover as by, for example, formation or application of a conductive layer, patterning and etching.

Figure 14B:
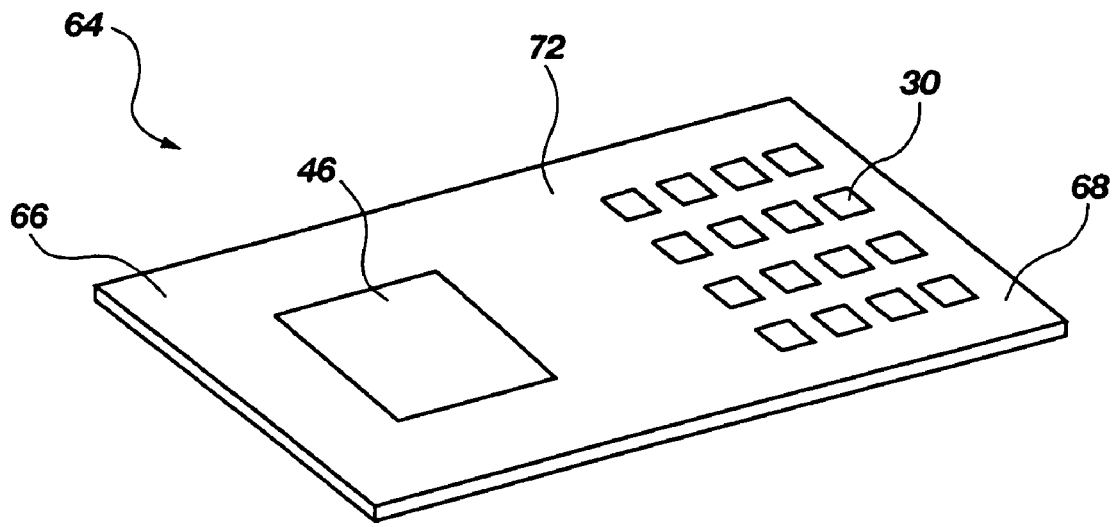
Figure 15A:
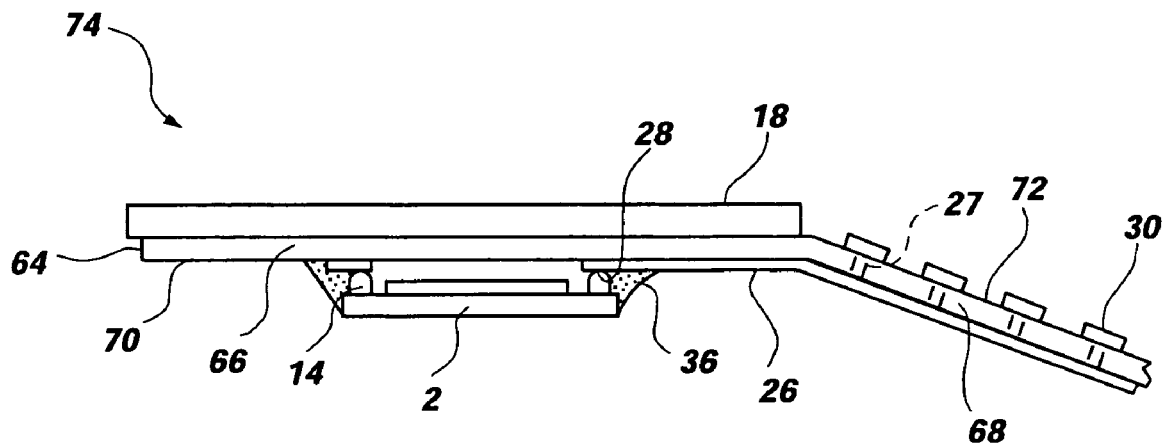
FIGS. 15A and 15B are sectional side views showing an image sensor package according to the fourth embodiment of the present invention.

FIG. 15A shows a sectional side view of an image sensor package 74 according to the fourth embodiment of the present invention. Mounting portion 66 is adhesively secured to transparent substrate 18 in the same manner as secondary substrate 44 in the second embodiment. Backing portion 68 extends laterally outwardly from an edge of transparent substrate 18. Conductive bumps 14 on image sensor chip 2 are bonded to first attachment points 28 such that sensing circuitry 10 is exposed through aperture 46 (FIGS. 14A and 14B). A bead of sealant 36 is also deposited around the sides 8 of image sensor chip 2 and contacts first side 70 of flex circuit 64.

Figure 15B:
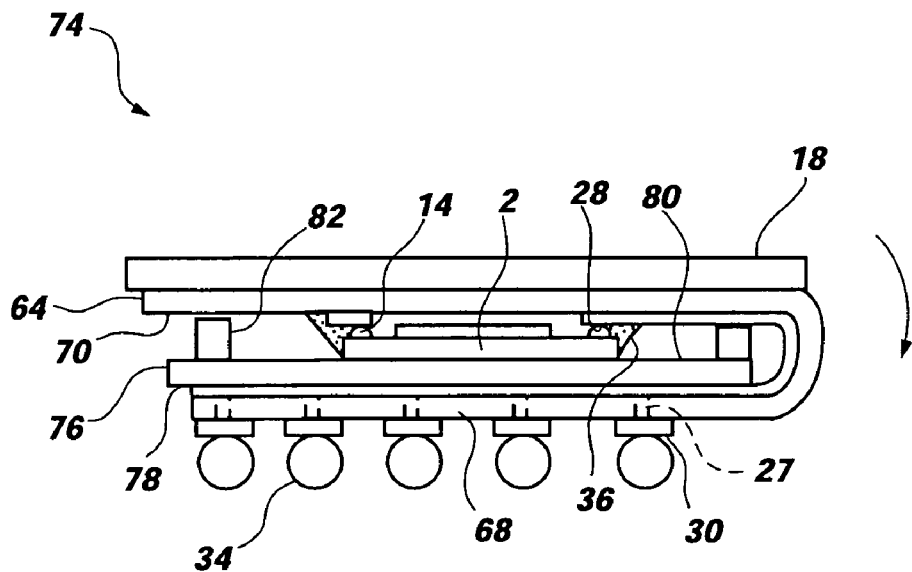

As seen in FIG. 15B, backing portion 68 is subsequently bent over or folded such that the full array of second attachment points 30 faces in a downward direction below image sensor chip 2. In a presently preferred embodiment, a first side 78 of a rigid substrate 76 is adhesively attached to backing portion 68 on first side 70 of flex circuit 64 for support when image sensor package 74 is later placed on carrier substrate 38. Rigid substrate 76 may be prefabricated with flex circuit 64 before connection of image sensor chip 2 thereto, or may be attached at a later point during formation of image sensor package 74. Rigid substrate 76 may be formed of any suitably rigid material. It may be formed, for example, of a metal (suitably electrically insulated from conductive traces 26) which would also aid in heat dissipation when attached to image sensor chip 2. Furthermore, rigid substrate 76 may itself be formed with conductive traces with ends extending from second attachment points 30 to locations over vias arranged to correspond with vias 27 and disposed on the outside of backing portion 68 with its vias and aligned with vias 27 on flex circuit 64. A second side 80 of rigid substrate 76 is further adhesively attached to back surface 6 of image sensor chip 2 to hold flex circuit 64 in the folded position. Conventional adhesives may be used for attaching rigid substrate 76 to flex circuit 64 and image sensor chip 2. Alternatively or additionally, rigid substrate 76 may be held in place with stand-off structures 82 attached between second side 80 thereof and first side 70 of flex circuit 64 on mounting portion 66. Stand-off structures 82 may be integrally formed with rigid substrate 76 (as by molding) and attached to mounting portion 66, or may be separate structures attached by any known methods, for instance, by adhesive bonding or press-fitting into apertures therein.

As with backing cap 48 in the third embodiment, discrete conductive elements 34 may be attached to or formed on second attachment points 30, or may be omitted to form a land-grid array-type package.

Figure 16:
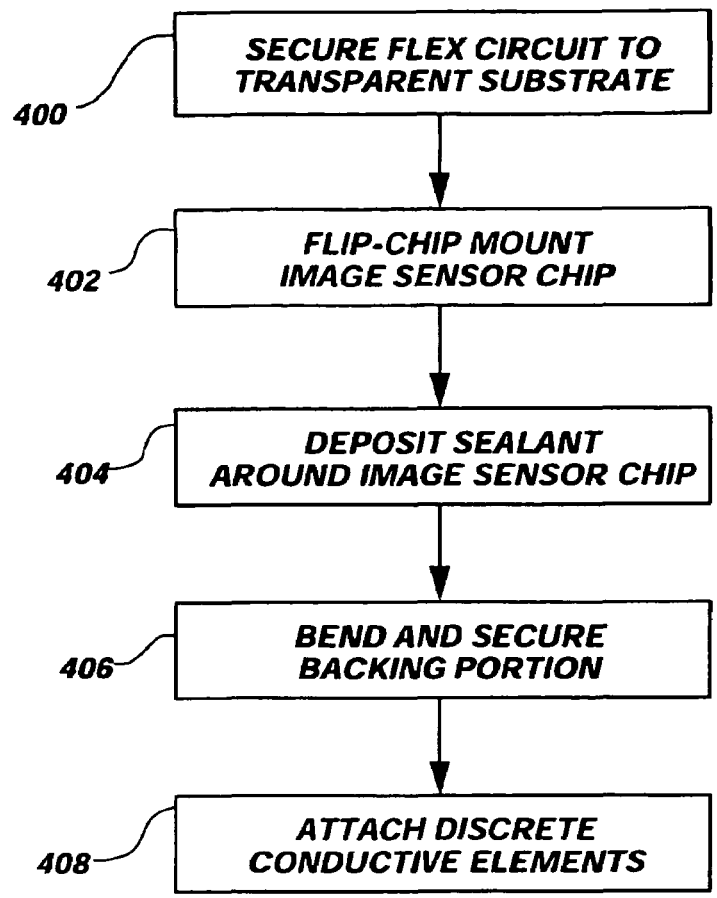
FIG. 16 is a flow chart showing a method of fabrication according to the fourth embodiment of the present invention.

FIG. 16 shows a flow chart of an exemplary method of assembly for the fourth embodiment of the present invention. First, in action 400, mounting portion 66 having aperture 46 and first attachment points 28 is adhesively secured to transparent substrate 18. In action 402, image sensor chip 2 is flip-chip mounted by bonding conductive bumps 14 to first attachment points 28. In action 404, a bead of sealant is deposited around image sensor chip 2, contacting sides 8 and first side 70 of flex circuit 64. In action 406, backing portion 68 having optionally preattached rigid substrate 76 and a fully populated array of second attachment points 30 is bent over and secured in place with an adhesive material previously applied to second side 80 of rigid substrate 76 and/or to back surface 6 of image sensor chip 2. Alternatively or additionally, backing portion 68 is secured by the use of stand-off structures 82. Finally in action 408, if a land-grid array-type package is not desired, discrete conductive elements 34 are formed on or attached to the full array of second attachment points 30 on second side 72 of flex circuit 64.

Figure 17:
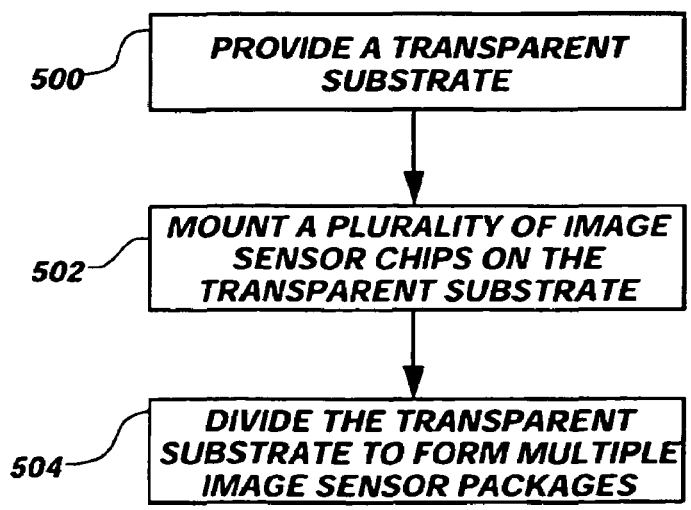
FIG. 17 is a flow chart showing a method of fabrication according to a further variation of the present invention.

In a further variation to any of the above-described package embodiments, depicted in the flow chart of FIG. 17, an array of image sensor packages may be simultaneously formed on one large transparent substrate 18 (actions 500, 502), which is then cut or otherwise divided to form multiple individual image sensor packages (action 504). The method of assembly for each of the embodiments may proceed in the same fashion as previously described, with singulation occurring, with the exception of the fourth embodiment, after attachment of discrete conductive elements 34 or backing cap 48. Of course, singulation may be carried out at an earlier point in the package fabrication process if so desired. Further, it is contemplated that backing caps 48 might also be constructed as a unitary array of backing caps 48 (molded, for example, with runners extending therebetween) which may then be divided along with the large transparent substrate 18 during singulation. In addition, if a secondary substrate is employed in accordance with the second embodiment, it may be of like size and shape to that of the transparent substrate, applied thereto and singulated therewith.

All of the disclosed embodiments of the present invention provide durable image sensor packaging that is simple to fabricate, suitable for high I/O sensor devices and easily mounted to a larger circuit assembly without the use of special carrier substrate apertures or depressions. Although the present invention has been depicted and described with respect to the illustrated embodiments, various additions, deletions and modifications are contemplated within its scope or essential characteristics. For instance, sealant 36 may be deposited to cover the entire sides 8 and back surface 6 of image sensor chip 2 for greater protection, or an additional deposition of another encapsulant material could be used for this purpose. Also, actions of the exemplary assembly methods could be carried out in a different order, such as by attaching discrete conductive elements 34 to backing cap 48 or flex circuit 64 in a prefabrication process. Furthermore, while described in the context of an image sensor package, the present invention has utility for the packaging of numerous types of optically interactive electronic devices. The scope of the present invention is, therefore, indicated by the appended claims rather than the foregoing description. All changes which come within the meaning and range of equivalency of the claims are to be embraced within their scope.

What is claimed is:

1. A method for fabricating an electronic device package, comprising:
    forming a plurality of conductive traces on a surface of a transparent substrate, each conductive trace of the plurality of conductive traces having a first attachment point and a second attachment point;
    providing an optically interactive electronic device having at least one bond pad on an active surface thereof;
    bonding the at least one bond pad of the optically interactive electronic device to the first attachment point of a conductive trace of the plurality of conductive traces;
    providing a backing cap having a base and sidewalls extending transversely from a perimeter of the base and at least one conductive pad on a first surface of the base thereof; and
    attaching the backing cap to the transparent substrate to cover a back surface of the optically interactive electronic device and provide electrical communication between the second attachment point of the conductive trace and the at least one conductive pad on the first surface of the backing cap.

2. The method according to claim 1, wherein forming a plurality of conductive traces on a surface of a transparent substrate comprises forming the second attachment points of the plurality of conductive traces in at least one row extending adjacent a perimeter portion of the surface of the transparent substrate.

3. The method according to claim 2, further comprising:
    forming the second attachment points of the plurality of conductive traces in multiple rows extending adjacent the perimeter portion of the surface of the transparent substrate.

4. The method according to claim 1, wherein forming a plurality of conductive traces on a surface of a transparent substrate comprises:
    disposing a conductive or conductor-filled material onto the surface of the transparent substrate in a pattern defining the plurality of conductive traces.

5. The method according to claim 1, wherein forming a plurality of conductive traces on a surface of a transparent substrate comprises:
    disposing a layer of conductive material on the surface of the transparent substrate; and
    selectively etching the conductive material to define the plurality of conductive traces.

6. The method according to claim 1, further comprising:
    depositing a bead of sealant material on the surface of the transparent substrate along at least one side of the optically interactive electronic device and in contact therewith.

7. The method according to claim 6, wherein the sealant material is selected to comprise one of epoxy and silicone.

8. The method according to claim 1, wherein the optically interactive electronic device is selected to comprise an image sensor.

9. The method according to claim 1, further comprising:
    mounting a plurality of optically interactive electronic devices on a single transparent substrate; and
    dividing the single transparent substrate to provide individual electronic device packages.

10. The method according to claim 1, wherein attaching the backing cap to the transparent substrate comprises forming a bond between the at least one backing cap conductive pad and the second attachment point of the conductive trace, the bond being selected to comprise one of a conductive or conductor-filled epoxy, a solder joint and a layer of anisotropically conductive adhesive material.

11. The method according to claim 1, further comprising:
    forming an array of attachment pads on a second surface of the backing cap.

12. The method according to claim 11, further comprising:
    providing a discrete conductive element on at least one attachment pad of the array of attachment pads on the second surface of the backing cap.

13. The method according to claim 12, wherein the discrete conductive element is selected to comprise one of a solder ball, a solder column, a conductive epoxy, and a conductor-filled epoxy.

* * * * *

UNITED STATES PATENT AND TRADEMARK OFFICE
CERTIFICATE OF CORRECTION

PATENT NO. : 7,122,390 B2
APPLICATION NO. : 11/152519
DATED : October 17, 2006
INVENTOR(S) : Kinsman Page 1 of 1

It is certified that error appears in the above-identified patent and that said Letters Patent is hereby corrected as shown below:

On the face page, in field (56), under "U.S. Patent Documents", in column 2, line 7, delete "6,400,075 B1" and insert -- 6,400,075 B2 --, therefor.

On the face page, in field (56), under "U.S. Patent Documents", in column 2, line 8, delete "6,472,761 B1" and insert -- 6, 472,761 B2 --, therefor.

On the face page, in "Primary Examiner", in column 2, line 1, delete "Chamblis" and insert -- Chambliss --, therefor.

Signed and Sealed this

Fifteenth Day of April, 2008

JON W. DUDAS
*Director of the United States Patent and Trademark Office*